MULTI-EMITTER SEMICONDUCTOR DEVICE

Filed Oct. 12, 1965

INVENTORS
GERALD S. WORCHEL
ROBERT L. REBER
BY
[signature]
ATTORNEY 3,462,658

MULTI-EMITTER SEMICONDUCTOR DEVICE

Gerald S. Worchel, Eatontown, N.J., and Robert L. Reber, Cupertino, Calif., assignors to The Bendix Corporation, Eatontown, N.J., a corporation of Delaware Filed Oct. 12, 1965, Ser. No. 495,079
Int. Cl. H01l 11/02, 15/00
U.S. Cl. 317—235 7 Claims

ABSTRACT OF THE DISCLOSURE

A multi-emitter transistor having a common base and collector in which each emitter is connected by a thin film resistor to a common emitter contact. The resistors are insulated by an oxide from the base and also from a portion of the common emitter contact.

The present invention relates to semiconductor devices and more particularly to a multiple emitter transistor with series thin film resistors.

One disadvantage of transistors is the limitation on the power handling capability. This is especially true of silicon. Various attempts have been made to connect devices together to provide improved power handling capability. However, considerable difficulty has been encountered, not only in the connections but also in the operation.

The present invention provides a multiple emitter transistor with a thin film resistor in series with each emitter.

It is an object of the invention to provide an improved semiconductor device.

Another object of the invention is to provide a novel multiple emitter transistor.

Another object of the invention is to provide an improved power transistor.

Another object of the invention is to provide improved means for making contacts to a transistor.

Another object of the invention is to provide an improved process for fabricating a semiconductor device.

Another object of the invention is to provide an improved thin film resistor.

The above and other objects and features of the invention will appear more fully hereinafter from a consideration of the following description taken in connection with the accompanying drawings wherein one embodiment is illustrated by way of example.

Figures 1, 2:
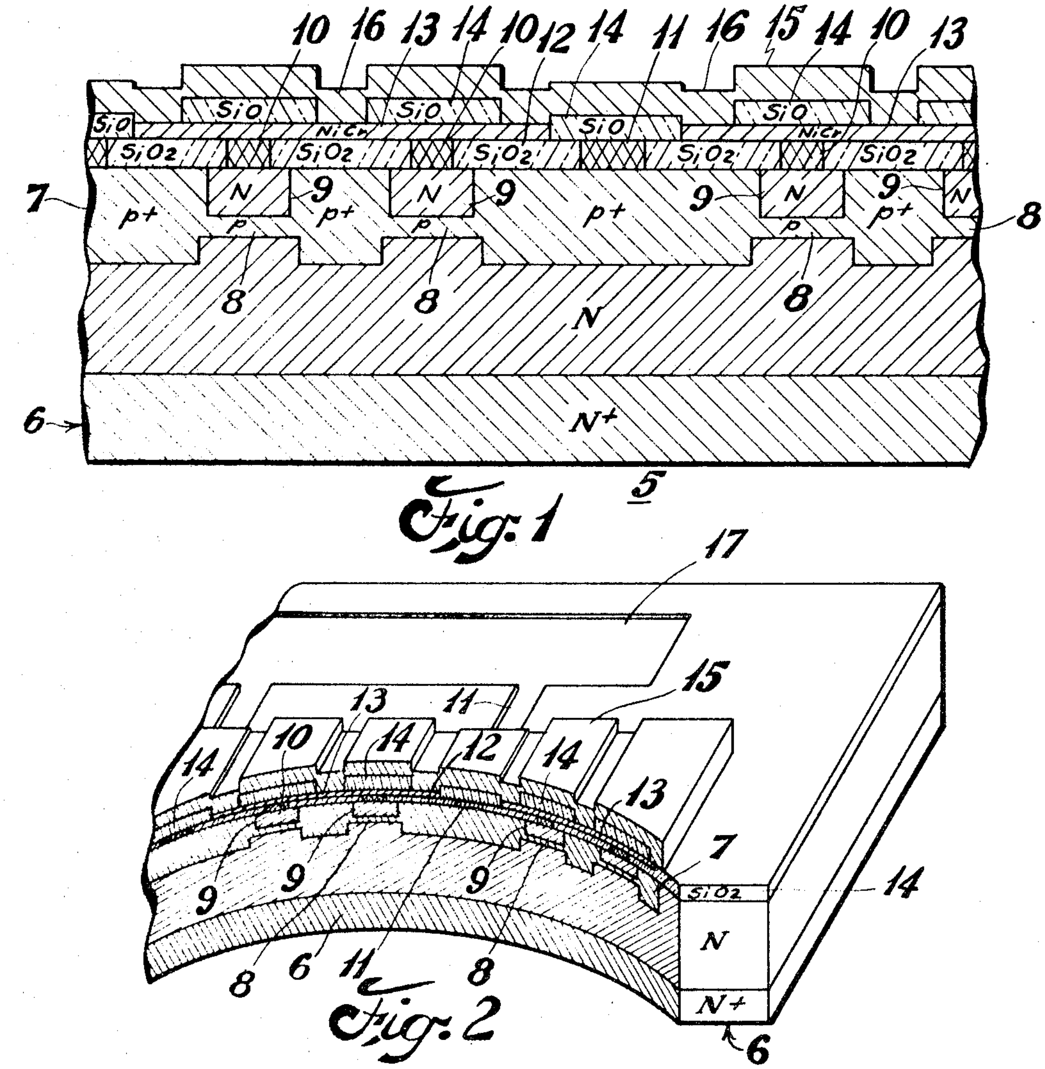
FIGURE 1 is a cross section view of a device embodying the invention.
FIGURE 2 is a partial cutaway perspective view of the device of FIGURE 1.
Figure 3:
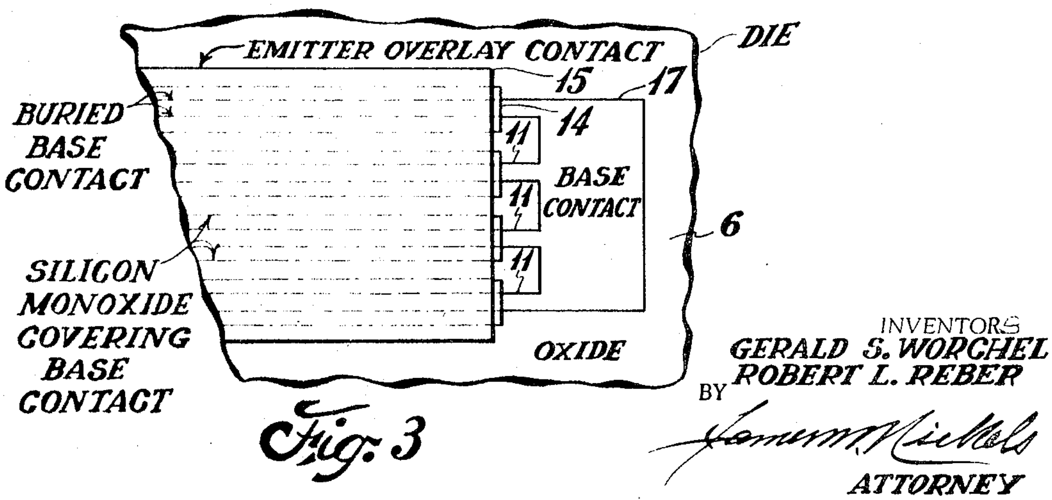
FIGURE 3 is a partial top view of the device of FIGURE 1.

Referring now to FIGURES 1 and 2 of the drawings, a semiconductor device is indicated generally by the numeral 5, which for the purpose of illustration, may be a multiple emitter silicon transistor. The device 5 includes a die of NN+silicon 6 having a layer of silicon dioxide 12 ($SiO_2$) thereon. The die 6 is masked, an opening formed, and diffused to form a predetermined P+ pattern 7. Next, by masking, etching, and diffusing, a predetermined P pattern 8 is formed. N type impurities are diffused by masking and etching to form a plurality of emitters 9 in the die 6. Thus, the emitters 9 are in alignment with the P portion 8 which form the base and the NN+ section the collector. It is understood that the invention is not limited to a NPN or variations thereof, but could be PNP or variations thereof.

By proper masking, openings are etched in the silicon dioxide 12 over the emitters 9 and base 7. Contacts 10 are provided for the emitters 9 and contacts 11 are provided for the base 7. The contacts 10 and 11 may, for example, be applied by evaporating aluminum through a proper mask. It is understood that other contact material and processes could be used.

Next, the base contacts 11 are masked and thin film resistors 13 are deposited. For example, the resistor 13 may be formed by evaporating nichrome, or other suitable material which is of a proper value in order to obtain the value of resistance desired. The resistors 13 are in ohmic contact with the respective emitter contacts 11. After the resistors 13 have been deposited, silicon monoxide (SiO) 14 is deposited over the resistors 13 and base contacts 11 through a mask to center the SiO 14 over the emitter terminals 10 and base terminals 11 and leave portions of the resistors 13 exposed.

An emitter overlay contact 15 is deposited over the dielectric SiO 14 with portions 16 of the contact 15 being in ohmic contact with the resistors 13. The contact 15 may be any one of a number of suitable metals or alloys, for example, lead, gold, silver, just to name a few. The base contacts 11 are buried under the dielectric layer 14 which in turn is under the emitter overlay contact 15. The base contacts 11 extend to a base bonding pad 17. The emitter-base contact capacitance can be controlled by changing the distance between the contacts by changing the amount of dielectric between the two. In general, if the distance between the contacts is equal to or greater than $3 \times 10^{-4}$ cm., the amount of capacitance added to the junction capacitance is negligible.

A device in accordance with the invention provides high reliability for if one emitter should start drawing current, its series resistor would cut off the emitter and the device would continue normal operation. Other advantages are that it provides a high yield. Also it is not limited to any specific geometry and offers many variations for making external connections. The resistor material, dielectric material and contact material can be of a number of suitable materials. It provides improved power handling capability due to the emitter series resistance, the uniform current distribution resulting from contact over the entire emitter region as opposed to a pad at the end of emitter fingers. Further, the size of the emitter bonding area lends itself to the bonding or soldering of much heavier lead material than has presently been possible in planor interdigitated geometrics.

Although only one embodiment of the invention has been illustrated and described, various changes in the form and relative arrangement of the parts, which will now appear to those skilled in the art, may be made without departing from the scope of the invention.

What is claimed is:

1. A transistor device comprising a plurality of individual junction transistors having a single semiconductor body with a common collector, a contiguous base region common to said plurality of transistors, a plurality of individual emitters forming separate rectifying junctions with said base region, an oxide coating covering said junctions, a thin film resistor overlying said oxide coating and in ohmic contact with said emitters, a base contact in ohmic contact with said base region, an oxide coating over said base region, an oxide coating over said base contact and over predetermined portion of said resistor, and a common emitter overlay contact over said last oxide coating and forming an ohmic contact with the exposed portion of said resistor.

2. The combination as set forth in claim 1 and including a buried base contact insulated from said emitter contact and said resistors.

3. The combination as set forth in claim 1 in which said semiconductor body is silicon.

4. The combination as set forth in claim 1 in which said resistor is nichrome.

5. The combination as set forth in claim 1 in which there is a plurality of resistors.

6. The combination as set forth in claim 1 in which said base contact extends to a base bonding pad.

7. A semiconductor device comprising a wafer of semiconductor material having a first layer of one type of conductivity and a layer of a different type of conductivity forming a collector and base respectively, a plurality of emitters of the type of conductivity as said first layer forming rectifying junctions with said layer of a different type of conductivity, an overlay emitter contact, thin film resistors connecting each of said emitters to said overlay emitter contact at predetermined points, insulating means insulating said resistors from said base and said base and said other portion of said overlay emitter contact, a buried base contact, and other insulating means insulating said base contact from said emitter overlay contact.

References Cited

UNITED STATES PATENTS

| | | | |
|---|---|---|---|
| 3,312,882 | 4/1967 | Pollock | 317—235 |
| 3,345,210 | 10/1967 | Wilson | 117—212 |
| 3,325,258 | 6/1967 | Fottler | 29—183.5 |
| 3,360,688 | 12/1967 | Triggs. | |

OTHER REFERENCES

Electronics, Aug. 23, 1965, pp. 71-83.

JOHN W. HUCKERT, Primary Examiner

M. EDLOW, Assistant Examiner

U.S. Cl. X.R.

307—303; 317—234; 330—38